United States Patent [19]

Tanaka et al.

[11] Patent Number: 4,679,249

[45] Date of Patent: Jul. 7, 1987

[54] WAVEGUIDE-TO-MICROSTRIP LINE COUPLING ARRANGEMENT AND A FREQUENCY CONVERTER HAVING THE COUPLING ARRANGEMENT

[75] Inventors: Toshihide Tanaka, Ikoma; Hiroshi Saka, Osaka; Yoshikazu Yoshimura, Osaka; Yasuhumi Shiomi, Osaka, all of Japan

[73] Assignee: Matsushita Electric Industrial Co., Ltd., Japan

[21] Appl. No.: 701,912

[22] Filed: Feb. 14, 1985

[30] Foreign Application Priority Data

Feb. 15, 1984 [JP] Japan ................... 59-26301
Feb. 15, 1984 [JP] Japan ................... 59-26302

[51] Int. Cl.$^4$ ................... H04H 1/26; H01P 5/107
[52] U.S. Cl. ................... 455/328; 455/327; 333/26; 333/33; 333/21 R
[58] Field of Search ................... 333/26, 33–35, 333/21 R; 455/327, 328, 323, 325, 333, 293, 282, 281, 275

[56] References Cited

U.S. PATENT DOCUMENTS 3,928,825 12/1975 Kaffenberger et al. ....... 333/21 R X
3,988,702 10/1976 Kaffenberger ................ 333/33
4,270,224 3/1981 Blondel et al. ................ 455/327
4,412,354 10/1983 Hu ................................ 455/327

FOREIGN PATENT DOCUMENTS 0009348 1/1977 Japan ........................ 333/33
0075249 6/1977 Japan ........................ 333/33
0134515 8/1983 Japan ........................ 455/327
0085104 6/1986 Japan ........................ 333/33

Primary Examiner—Eugene R. LaRoche
Assistant Examiner—Benny Lee
Attorney, Agent, or Firm—Lowe, Price, LeBlanc, Becker & Shur

[57] ABSTRACT

In a waveguide-to-microstrip line coupling arrangement, a microstrip line is placed on an outer surface of a wall of a waveguide which is coupled with the microstrip line via a metallic post connected at its one end to a center strip conductor of the microstrip line and is inserted inside the waveguide via through-holes made in a ground plane of the microstrip line and in the wall of the waveguide where the diameter of the through-hole made in the ground plane is made smaller than that of the through-hole made in the wall of the waveguide. The waveguide has a short-circuited end and the metallic post is placed close to the short-circuited end. The coupling arrangement may be used in a microwave frequency converter having an microwave integrated circuit including a local oscillator and a mixer, where the MIC is located on an outer surface of a longitudinal wall extending from a short-circuited end to an open end.

13 Claims, 12 Drawing Figures

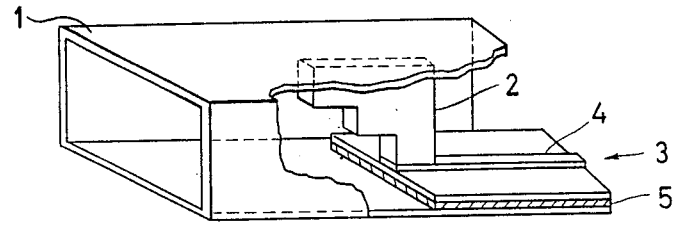
FIG. 1 PRIOR ART
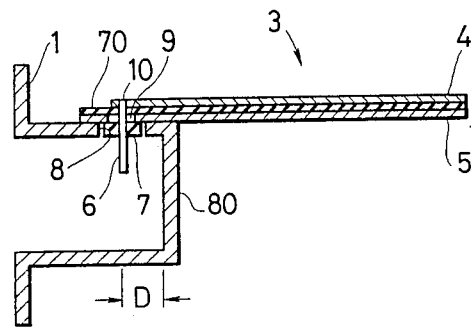
FIG. 2A
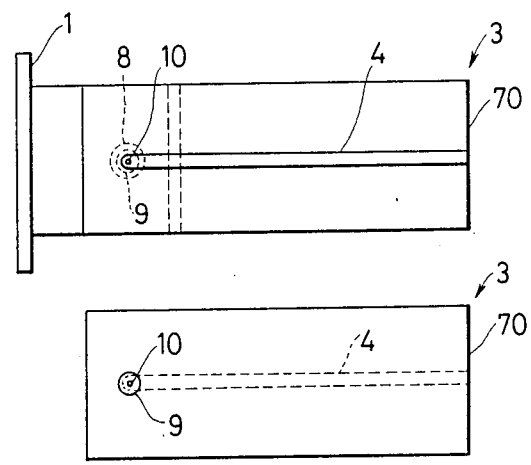
FIG. 2B
FIG. 2C

WAVEGUIDE-TO-MICROSTRIP LINE COUPLING ARRANGEMENT AND A FREQUENCY CONVERTER HAVING THE COUPLING ARRANGEMENT

BACKGROUND OF THE INVENTION

This invention relates generally to microwave devices, and particularly to a waveguide-to-microstrip line coupling arrangement and a microwave frequency converter including such a coupling arrangement.

Microwave semiconductor devices using GaAs FETs have been developed recently, and microstrip integrated circuits (MICs) are widely used. In a microwave receiver to be connected to a parabolic antenna, such as in an SHF receiver used for receiving satellite broadcasting waves, a radio frequency (RF) signal fed from a parabolic antenna has to be fed from a waveguide to a microstrip line. According to a conventional waveguide-to-microstrip line coupling arrangement, a ridge waveguide is used and therefore the structure is complex. Furthermore, since the waveguide is short-circuited to the microstrip line via the ridge waveguide in connection with d.c., a blocking circuit is required at an input of an MIC when the MIC comprises active devices. As a result, insertion loss in increased or noise figure is increased. Furthermore, when it is intended to keep the coupling between the waveguide and the microstrip line throughout a wide frequency range, it is necessary to employ a number of stages of ridge waveguides which results in increase in size and insertion loss.

SUMMARY OF THE INVENTION

The present invention has been developed in order to remove the above-described drawbacks inherent to the conventional waveguide-to-microstrip line coupling arrangements and microwave devices, such as a microwave frequency converter, including such coupling arrangements.

It is, therefore, an object of the present invention to providie a new and useful waveguide-to-microstrip line coupling arrangement and a microwave frequency converter including the coupling arrangement so that impedance matching is satisfactory throughout a wide frequency range while insertion loss is small.

According to a feature of the present invention a microstrip line is placed on an outer surface of a wall of a waveguide, and a center strip conductor of the microstrip line is coupled with the waveguide via a metallic post which is connected at its one end to the center strip conductor and is inserted inside the waveguide via through-holes made in a ground plane of the microstrip line and in the wall of the waveguide where the diameter of the through-hole made in the ground plane is made smaller than that of the through-hole made in the wall of the waveguide. The waveguide has a short-circuited end and the metallic post is placed close to the short-circuited end. The coupling arrangement may be used in a microwave frequency converter having a microwave integrated circuit (MIC) including a local oscillator and a mixer, where the MIC is located on an outer surface of a longitudinal or H wall extending from a short-circuited end to an open end of the waveguide.

In accordance with the present invention there is provided a waveguide-to-microstrip line coupling arrangement comprising: a waveguide having one end which is short-circuited; a microstrip line having a ground plane, a dielectric substrate and a center strip conductor which are stacked in sequence, said microstrip line being positioned on an outer surface of a wall of said waveguide such that said ground plane is in contact with said waveguide; a metallic post connected to said center strip conductor at its one end and extending to the inside of said waveguide via through-holes made in said dielectric substrate, said ground plane and said wall of said waveguide, said through-holes being coaxial with said metallic post, and the diameter of said through-hole made in said ground plane being made smaller than that of said through-hole made in said wall of said waveguide.

In accordance with the present invention there is also provided a microwave frequency converter comprising: a waveguide whose pass band corresponds to the frequency of an RF signal and whose cutoff band corresponds to a local oscillator signal frequency which is lower than that of said RF signal, one end of said waveguide being short-circuited; a microwave integrated circuit attached to an outer surface of a wall of said waveguide, said microwave integrated circuit having a microstrip line including a ground plane, a dielectric substrate and a center strip conductor which are stacked in sequence, said microstrip line being positioned on an outer surface of a wall of said waveguide such that said ground plane is in contact with said waveguide; a metallic post connected to said center strip conductor at its one end and extending to the inside of said waveguide via through-holes made in said dielectric substrate, said ground plane and said wall of said waveguide; and a local oscillator and a mixer both formed within said microwave integrated circuit for converting said RF signal from said waveguide into an IF signal using.

BRIEF DESCRIPTION OF THE DRAWINGS

The object and features of the present invention will become more readily apparent from the following detailed description of the preferred embodiments taken in conjunction with the accompanying drawings in which:

FIG. 1 is a perspective view of a conventional waveguide-to-microstrip line coupling arrangment;

FIG. 2A is a cross-sectional side view of a first embodiment of the waveguide-to-microstrip line coupling arrangement;

FIG. 2B is a top plan view of the first embodiment coupling arrangement shown in FIG. 2A;

FIG. 2C is a bottm view of a part of the first embodiment coupling arrangement shown in FIG. 2A;

The same or corresponding elements and parts are designated at like reference numerals throughout the drawings.

DETAILED DESCRIPTION OF THE INVENTION

Figure 3:
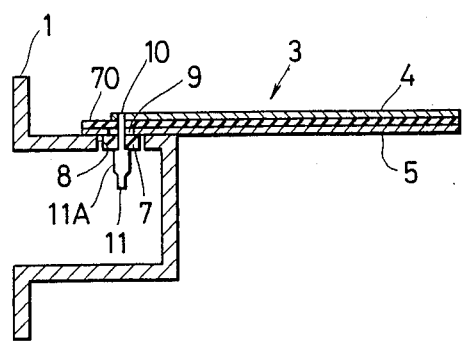
FIG. 3 is a cross-sectional side view of a second embodiment of the waveguide-to-microstrip line coupling arrangement.

Prior to describing the preferred embodiments of the present invention, the above-mentioned conventional waveguide-to-microstrip line coupling arrangement is described with reference to FIG. 1 for a better understanding of the present invention.

In FIG. 1, the reference 1 is a rectangular waveguide coupled to a microstrip line 3 having a center strip conductor 4 and a ground plane 5. The ground plane 5 is in contact with the inner surface of an H wall of the waveguide 1, and coupling between the waveguide 1 and the microstrip line 3 is made by a ridge 2 whose one end is placed on the center strip conductor 4. The ridge 2 converts a wavegide mode to a ridge waveguide mode, and further converts the latter to a microstrip line mode by lowering the impedance by way of the ridge 2 whose one end is in contact with the center strip conductor 4 of the microstrip line 3.

Such a conventional coupling arrangement is complex in structure because a ridge wave guide is used. Furthermore, since the microstrip line 3 is short-circuited to the waveguide 1, in connection with d.c., via the ridge 2, a d.c. blocking circuit is required in an input side when an active circuit is formed at the microstrip line. Provision of such a d.c. blocking circuit results in increase in insertion loss in the case of a microwave circuit, and deterioration in noise figure (NF) in an RF amplifier. Furthermore, when it is intended to keep the coupling between the waveguide and the microstrip line throughout a wide frequency range, it is necessary to employ a number of stages of ridge waveguides resulting in increase in size and insertion loss.

Referring now to FIGS. 2A to 2C, a first embodiment of the waveguide-to-microstrip line coupling arrangement is shown. The arrangement comprises a rectangular or a cylindrical waveguide 1, a microstrip line 3 placed on an outer surface of an H wall of the waveguide 1. The waveguide 1 has an open end and a short-circuited end 80 as shown. The references 4 and 5 are respectively a center strip conductor and a ground plane of the microstrip line 3, and the reference 70 is a dielectric substrate interposed between the center strip conductor 4 and the ground plane 5. One end of the center strip conductor 3 has a through-hole 10 in which a metallic post 6 is inserted. This metallic post 6 extends to the inside of the waveguide 1 to make an electromagnetic coupling between TE01 mode (or TE11 mode in the case of a cylindrical waveguide) of the waveguide 1 and a microstrip line mode so as to effect coupling therebetween. The metallic post 6 is secured to the center strip conductor 4 by way of soldering or the like so as to be electrically and physically connected and fixed thereto.

In order that the metallic post 6 extends to the inside of the waveguide 1, through-holes are made in the dielectric plate 70 and in the ground plane 5 respectively. The through-hole made in the ground plane 5 is indicated at the reference 9. Furthermore a through-hole 8 is made in the H wall of the waveguide 1. This through-hole 8 has a diameter larger than that of the metallic post 6 so that an annular cylindrical dielectric member 7 made of Teflon (trademark) is fitted therein surrounding the metallic post 6.

This annular cylindrical dielectric member 7 is employed for insulating, with respect to d.c., the metallic post 6 from the waveguide 1, and also for causing, with respect to a.c., the matallic post 6 and the wall defining the through-hole 8 to form a partial 50-ohm coaxial cable. The through-hole 8 made in the waveguide 1 and the through-hole 9 made in the ground plane 9 are coaxial with the through-hole 10 made in the center strip conductor 4. In other words, the through-holes 8 and 9 are both coaxial with the metallic post 6 which is perpendicular to the H wall of the waveguide 1.

With the above-described arrangement, the 50-ohm coaxial cable portion formed by the through-hole 8, the annular cylindrical dielectric member 7, and the metallic post 6 is perpendicular to the 50-ohm microstrip line 3, and because of edge effect impedances of these lines are high at their edges. Therefore, when the diameter of the through-hole 9 made in the ground plane 5 is made slightly smaller than the diameter of the through-hole 8 of the waveguide wall, the impedance of the coaxial cable portion is prevented from assuming a large value at its edge, and therefore the coaxial cable portion can be satisfactorily matched with the microstrip line 3.

With the provision of the metallic post 6 an RF signal within the waveguide 1 is effectively and smoothly transmitted to the microstrip line 3 via the metallic post 6. According to experiments, the following results have been obtained. The dielectric plate 70 of the microstrip line 3 is comprised of a Teflon glass fiber substrate having a thickness of 0.6 mm. The center strip conductor 4 has a width of approximately 1.5 mm, while the metallic post 6 has a diameter of approximately 1 mm, and its length within the waveguide 1 is approximately 4.5 mm. The diameter of the annular cylindrical member 7 is approximately 3 mm, and the diameter of the through-hole 8 for receiving the annular cylindrical member 7 is slightly larger than 3 mm. The diameter of the through-hole 9 of the ground plane 5 is approximately 2 mm. Furthermore, the metallic post 6 is located to have a distance from the short-circuiting wall 80 such that the distance D is less than ¼ of a wavelength λg in the waveguide 1 in the case of a WR75 rectangular waveguide, or the distance D is set to approximately 9.5 mm in the case of a CR62 cylindrical waveguide. Under the above-mentioned condition, a waveguide-to-microstrip line coupling arrangement exhibiting an insertion loss of 0.1 dB or less at 12 GHz band and having a wide range such that the band width is approximately 1 GHz has been obtained.

FIG. 3 shows a second embodiment of the waveguide-to-microstrip line coupling arrangement according to the present invention. This embodiment differs from the first embodiment of FIGS. 2A to 2C in that the metallic post 6 in FIG. 2A is replaced with a modified metallic post 11 having a thick portion at its middle. More specifically, the metallic post 11 has a large-diameter portion 11A at its middle so as to support the annular cylindrical dielectric member 7. As a result, the annular cylindrical dielectric member 7 is prevented from moving or disengaging.

In order that the modification of the shape of the metallic post to the shape shown in FIG. 3 does not result in undesirable change in electrical characteristics, the insertion length of the post 11 within the waveguide 1 and the diameter as well as the length of the thick portion 11A are all selected. One example of such selection is as follows:

Insertion length: approximately 5 mm
Diameter of the thick portion 11A: approximately 1.2 mm
Length of the thick portion 11A: approximately 2 mm Once the size of the metallic post 11 is determined appropriately, then satisfactory coupling characteristics are obtained.

Figure 4A:
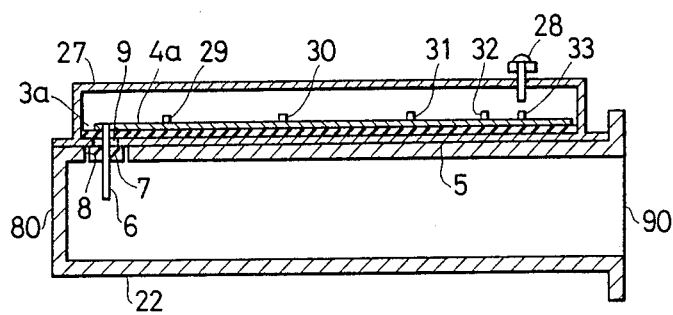
FIG. 4A is a cross-sectional side view of a frequency converter using the waveguide-to-microstrip line coupling arrangement according to the present invention.
Figure 4B:
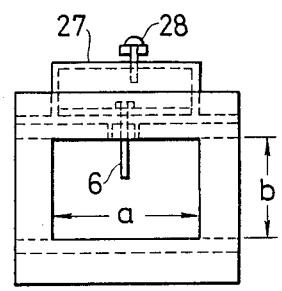
FIG. 4B is a front view of the frequency converter shown in FIG. 4A.

FIGS. 4A and 4B show another embodiment of the present invention, which embodiment is a microwave frequency converter using the waveguide-to-microstrip line coupling arrangement described in the above. The reference 22 is a rectangular waveguide whose cutoff band covers a local oscillator signal and whose pass band covers an RF signal. The size of a cross-section (see FIG. 4B) is given by a width a=14 and a height b=7. A microwave integrated circuit (MIC) 3a is formed on the surface of the H wall of the waveguide 22, and a metallic post 6 is inserted from the MIC 3a to the inside of the waveguide 22 at a position close to a short-circuited end 80 so as to couple the waveguide with the MIC 3a. The reference 7 is an annular cylindrical dielectric member made of Teflon which is fitted in a through-hole 8 made in the H wall of the waveguide 22 so that the metallic post 6 penetrates therethrough. This annular cylindrical dielectric member 7 is used to insulate, with respect to d.c., the metallic post 6 from the waveguide 22 and to form partially a coaxial cable where the impedance thereof is set to 50 ohms. The reference 9 is a through-hole made in a ground plane 5 of the MIC 3a which through-hole 9 is coaxial with the metallic post 6 and is also coaxial with the through-hole 8 of the waveguide 22. The through-hole 9 of the ground plane 5 has a diameter smaller than that of the through-hole 8 of the waveguide 22, and the diameter of the through-hole 9 is a little larger than the width of the center strip conductor 4 of the microstrip line.

The references 29 and 30 indicate RF amplifiers provided on the MIC 3a, the reference 31 being a mixer circuit, the reference 32 being a local oscillator, the reference 33 being a dielectric resonator for stabilized oscillation, the reference 28 being a local oscillator frequency adjusting screw provided to a shielding case 27 of the MIC 3a.

In the frequency converter of FIGS. 4A and 4B, and RF signal is fed from the waveguide 22 via the metallic post 6 to an input terminal 4a of the MIC 3a with a coupling loss being reduced because of the arrangement that the diameter of the through-hole 9 of the ground plane 5 is made smaller than the diameter of the through-hole 8 of the waveguide 22 where coupling is effected throughout a wide frequency range such as from 11.7 GHz to 12.7 GHz. The input RF signal is amplified by way of 2-stage RF amplifying circuits 29 and 30, and is frequency converted by the mixer 31 which receives local oscillating signal of approximately 10.7 GHz from the local oscillator 32. As a result, an intermediate frequency IF signal is derived from the mixer 31.

The frequency converter according to the present invention has a feature in that the MIC 3a is placed on an outer surface of the H wall of the waveguide 22 where an input terminal of the MIC 3a for receiving the RF signal from the waveguide 22 is placed close to the short-circuited end 80 of the waveguide 22. With this arrangement therefore, the entire length of the frequency converter is defined by the length of the MIC 3a. In other words, the entire length of the frequency converter can be shortened to the length of the MIC 3a. The inside size or diameter of the waveguide 22 is determined such that the waveguide 22 has a pass band for the RF signal and a cutoff band for the local oscillator signal so as to attenuate the local osillator signal thereby preventing spurious radiation of the same. Moreover, since the length of the waveguide 22 is much longer than that of conventional arrangements, the amount of attenuation of the local oscillator signal is very large.

Figure 4C:
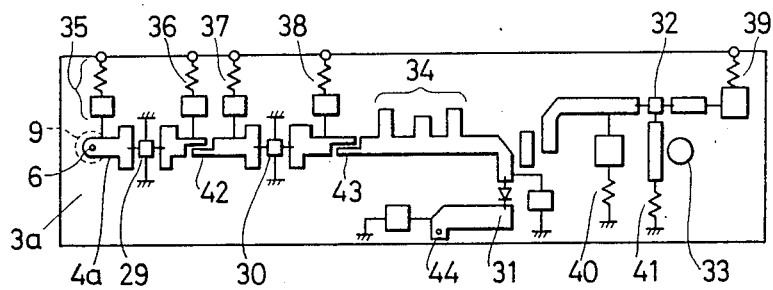
FIG. 4C is a circuit diagram of the frequency converter shown in FIG. 4A.

FIG. 4C shows a top plan view of the MIC 3a shown in FIGS. 4A and 4B. The RF signal fed via the metallic post 6 is amplified by the RF amplifiers 29 and 30 each comprising a microwave semiconductor such as a GaAs FET, and is fed via an image-rejection filter 34 to the mixer 31 to be mixed with the local oscillator signal from the local oscillator 32 which is stabilized by the dielectric resonator 33. As a result, an IF output is derived from an output terminal 44. In the arrangement shown in FIG. 4C, the references 35 and 37 are gate bias resistors also functioning as RF choke circuits for a first stage and a second stage respectively, and the references 36, 38 and 39 are drain resistors also functioning as RF choke circuits for the first stage, the second stage and the local oscillator 32. The references 40 is a source resistor, of the GaAs FET local oscillator 32, and the reference 41 is an RF choke circuit which also functions as a gate terminating resistor. The references 42 and 43 indicate d.c. blocking circuits. In this way, in the arrangement of FIG. 4C, the RF amplifiers 20 and 30, the mixer 31, and the local oscillator 32 are substantially arranged in line so that these circuits are formed on an elongate rectangular substrate to be compact. As a result, the MIC 3a is readily secured to the waveguide 22 to be substantially integral therewith. In addition, as shown in FIG. 4C, since power supply terminals connected to gates and drains of FETs are arranged at one side of the rectangular substrate, the MIC 3a is readily handled during manufacturing processes.

As will be understood from FIGS. 4A to 4C, the RF signal inputted to the waveguide 22 from an open end 90 propagates within the waveguide 22 toward the short-circuited end 80, i.e. leftward in the drawing, and is transmitted to the MIC 3a via the metallic post 6, and then propagates in a direction from the short-circuited end 80 to the open end 90, i.e. rightward in the drawing, along circuit elements of the MIC 3a so that an IF signal is derived from the output terminal 44 after frequency conversion.

Figure 5A:
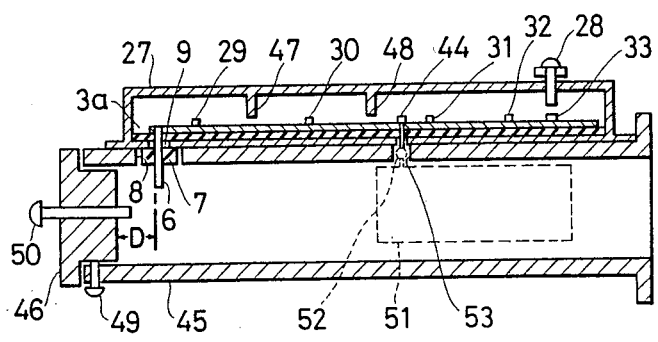
FIG. 5A is a cross-sectional side view of another frequency converter using the waveguide-to-microstrip line coupling arrangement according to the present invention.
Figure 5B:
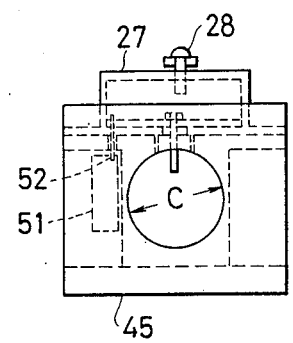
FIG. 5B is a front view of the frequency converter shown in FIG. 5A.

FIGS. 5A and 5B show another embodiment of a frequency converter according to the present invention. In this embodiment, a cylindrical waveguide 45 is used in place of the rectangular waveguide 22 of FIG. 4A. In the case of deriving an IF signal of 1 GHz band using an input RF signal of 12 GHz and a local oscillator signal around 10.7 GHz, when a cylindrical waveguide or CR 62 type (whose diameter is approximately 16 mm) is used as the waveguide 45, since cutoff frequency becomes approximately 11.2 GHz, attenuation of approximately 5 dB per 1 cm is obtained by the cylindrical waveguide 45 at the local oscillating frequency 10.7 GHz. As a result, suppose the length of the cylindrical waveguide 45 is 10 cm, both the local oscillator signal and the image signal can be attenuated by 50 dB and 100 dB respectively.

Therefore, superior characteristics as to the suppression of local oscillator signal radiation and image interference are obtained in the same manner as the embodiment of FIGS. 4A to 4C. In addition, since the waveguide 45 is cylindrical, mass-production of the waveguides is easy when compared with rectangular waveguides. Furthermore, since as a primary radiator of antennas for receiving satellite broadcasting involving circularly polarized wave often uses a cylindrical waveguide, the cylindrical waveguide 45 shows a high matching characteristic with such a cylindrical waveguide output antenna.

In FIG. 5A, the reference 46 is a short-circuiting plate for the cylindrical waveguide 45, and the distance D between the short-circuiting plate 46 and the metallic post 6 is set to a value between $\frac{1}{4}$ and $\frac{1}{3}$ of the wavelength $\lambda g$ within the waveguide 45 so as to provide effective matching between the cylindrical waveguide 45 and the MIC 3aq. The references 47 and 48 are partitions provided to the shielding case 27 so as to separate the RF amplifers 20 and 30 from each other, and the second RF amplifier 30 from the mixer 31 by shielding. In this way the partitions 47 and 48 are provided to reduce the coupling between respective circuits and to prevent the signal from the local oscillator 32 from returning the RF amplifers 29 and 30. The reference 49 is a screw for fixing the short-circuiting plate 46 to the waveguide 45. The reference 50 is an adjusting screw for adjusting input impedance. More specifically, the adjusting screw 50 is screwed into the short-circuiting plate 46 around a center thereof in such a manner than the screw 50 penetrates the short-circuiting plate 46. By adjusting the input impedance by way of the adjusting screw 50, the variation in the input impedance of the entire circuit viewed from the input of the waveguide 45, caused by the scattering of input impedances of GaAs FETs used in the MIC 3a, can be absorbed because electrostatic capacity between the tip of the adjusting screw 50 and the tip of the metallic post 6 varies as the distance therebetween changes. The reference 51 is an IF amplifier arranged substantially normal to the MIC 3a on an outer surface of the waveguide 45. This IF amplifier 51 is coupled with the IF output terminal 44 of the MIC 3a via a short coaxial cable 52 inserted in a through-hole 53 made in the H wall of the waveguide 45. In this way, since the IF amplifier 51 is coupled with the MIC 3a through a shortest distance, connection loss can be reduced, while a compact microwave frequency converter can be achieved.

Figure 6A:
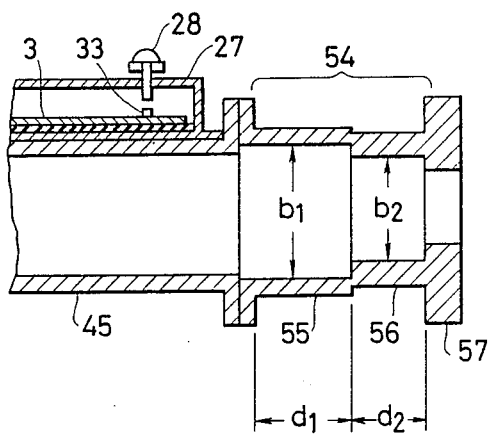
FIG. 6A is a cross-sectional side view of a further frequency converter using the waveguide-to-microstrip line coupling arrangement according to the present invention.
Figure 6B:
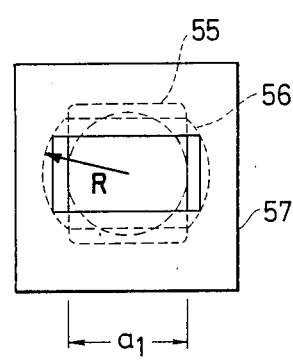
FIG. 6B is a front view of the frequency converter shown in FIG. 6A.

FIGS. 6A and 6B show another embodiment microwave frequency converter. As best seen in FIG. 6A, another waveguide 54 is attached to an open end of a cylindrical waveguide 45 which is substantially the same as that in FIGS. 5A and 5B. This additional waveguide 54 is a cylindrical-to-rectangular waveguide adapter which allows a rectangular waveguide to be used as an input waveguide, and comprises a substantially square waveguide 55 ($a_1 = 15$ mm, $b_1 = 18$ mm, $d_1 = 12$ mm), an oblong waveguide 56 (radius of arcuate portions R = 10 mm, $b_2 = 13$ mm, $d_2 = 8$ mm), and a rectangular waveguide 57 (WR75, $a_3 = 19.05$ mm, $b_3 = 9.5$ mm) which are all connected in tandem. In the above, the oblong waveguide 56 has an opening whose cross-section is formed of two parallel sides and two arcuate portions respectively extending from both ends of one of the parallel sides to the both ends of the other of the parallel sides. The cylindrical-to-rectangular waveguide adapter 54 is connected to the open end of the cylindrical waveguide 45 which open end functions as an input port. As a result, coupling between a cylindrical waveguide (CR62) and a rectangular waveguide (WR75) can be effectively made throughout a wide range of an RF signal band (for instance, from 11.7 GHz to 12.7 GHz) with a small insertion loss. Therefore, the microwave frequency converter having a cylindrical waveguide input can be readily changed to one having a rectangular waveguide input without deteriorating noise figure. When the cylindrical-to-rectangular waveguide adapter 54 is attached to the cylindrical input of the cylindrical waveguide 45 shown in FIG. 5A, a microwave frequency converter having a rectangular waveguide input can be simply provided without deteriorating noise figure, etc, which are originally required while an advantage of the cylindrical waveguide as to suppression of radiation of a local oscillator signal is also kept. Generally speaking, since there are many microwave parabolic antennas having a rectangular waveguide output, the arrangement shown in FIGS. 6A and 6B can be satisfactorily used for such antennas.

The above-described embodiments are just examples of the present invention, and therefore, it will be apparent for those skilled in the art that many modifications and variations may be made without departing from the scope of the present invention.

What is claimed is:

1. A waveguide-to-microstrip line coupling arrangement comprising:
   (a) a waveguide having one end which is short-circuited;
   (b) a microstrip line having a ground plane, a dielectric substrate and a center strip conductor which are stacked in sequence, said center strip conductor having a semicircular end having a radius which corresponds to one half the width of said center strip conductor, said microstrip line being positioned on an outer surface of a wall of said waveguide such that said ground plane is in contact with said waveguide;
   (c) a metallic post having cylindrical portions, said post having one end adjacent to and connected to said center strip conductor, said metallic post extending from a center of a circle defined by said center conductor, said circle having a half portion which corresponds to said semicircular end of said center conductor, to the inside of said waveguide via circular through-holes made in said dielectric substrate, said ground plane, and said wall of said waveguide,
   said circular through-holes being coaxial with said metallic post, and the diameter of said circular through-holes made in said ground plane being made smaller than that of said circular through-holes made in said wall of said waveguide said cylindrical portions of, said metallic post including a largediameter portion interposed between first and second smalldiameter portions; and
   (d) an annular cylindrical dielectric member fitted in said circular through-hole of said wall of said waveguide such that said first small-diameter portion of said metallic post penetrates said annular cylindrical dielectric member and said annular cylindrical dielectric member is supported by one end surface of said large-diameter portion.

2. A waveguide-to-microstrip line coupling arrangement as claimed in claim 1, wherein the diameter of said through-hole made in said wall of said waveguide is made larger than the width of said center strip conductor of said microstrip line, and wherein the diameter of said through-hole made in said ground plane is made larger than the width of said center strip conductor.

3. A waveguide-to-microstrip line coupling arrangement as claimed in claim 1, wherein said microstrip line extends along said outer surface of said wall which extends from a short-circuited end to an open end of said waveguide.

4. A waveguide-to-microstrip line coupling arrangement as claimed in claim 1, wherein said waveguide is a cylindrical waveguide.

5. A waveguide-to-microstrip line coupling arrangement as recited in claim 1 wherein said dielectric substrate is comprised of Teflon glass fiber.

6. A waveguide-to-microstrip line coupling arrangement as recited in claim 5 wherein said annular cylindrical dielectric member is comprised of Teflon glass fiber.

7. A waveguide-to-microstrip line coupling arrangement as recited in claim 1 wherein said annular cylindrical dielectric member is comprised of Teflon glass fiber.

8. A microwave frequency converter comprising:
(a) a waveguide having a pass band covering an RF signal frequency and a cutoff band covering a local oscillator signal frequency which is lower than that of said RF signal frequency, one end of said waveguide being short-circuited;
(b) a microwave integrated circuit attached to an outer surface of a wall of said waveguide, said microwave integrated circuit having a microstrip line including a ground plane, a dielectric substrate and a center strip conductor which are stacked in sequence, said center strip conductor having a semicircular end whose radius corresponds to one half the width of said center strip conductor, said microstrip line extending along said outer surface of said wall, extending from the short-circuited end of said waveguide such than said ground plane, is in contact with said waveguide;
(c) a metallic post having cylindrical portions, said post having one end adjacent to and connected to said center strip conductor, said metallic post extending from a center of a circle defined by said center conductor, said circle having a half portion which corresponds to said semicircular end of said center conductor, to the inside of said waveguide via circular through-holes made in said dielectric substrate, said ground plane, and said wall of said waveguide, said circular through-holes being coaxial with said metallic post, and the diameter of said circular through-hole made in said ground plane being made smaller than that of said circular through-hole made in said wall of said waveguide, said
cylindrical portions of said metallic post including a large-diameter portion interposed between first and second small-diameter portions;
(d) an annular cylindrical dielectric member fitted in said circular through-hole of said wall of said waveguide such that said first small-diameter portion of said metallic post penetrates said annular cylindrical dielectric member and said annular cylindrical dielectric member is supported by one end surface of said large-diameter portion; and
(e) a local oscillator and a mixer both formed within said microwave integrated circuit for converting said RF signal from said waveguide into an IF signal.

9. A microwave frequency converter as claimed in claim 8, wherein said waveguide is a cylindrical waveguide.

10. A microwave frequency converter as claimed in claim 9, further comprising, at a cylindrical waveguide input side, a cylindrical-to-rectangular waveguide adapter having an oblong waveguide and a substantially square waveguide, said oblong waveguide having an opening defined by a pair of parallel sides having equal length and a width greater than the height of an E-plane of said square waveguide, and symmetrical arcuate sides whose diameter is shorter than the length of a diagonal of said square waveguide and longer than the width of an H-plane of said square waveguide, the width of said square waveguide corresponding to said H-plane being substantially equal to the diameter of said cylindrical waveguide and the height of said square waveguide corresponding to said E-plane being substantially longer than the diameter of said cylindrical waveguide.

11. A microwave frequency converter as recited in claim 8 wherein said dielectric substrate is comprised of Teflon glass fiber.

12. A microwave frequency converter as recited in claim 11 wherein said annular cylindrical dielectric member is comprised of Teflon glass fiber.

13. A microwave frequency converter as recited in claim 8 wherein said annular cylindrical dielectric member is comprised of Teflon glass fiber.

* * * * *